United States Patent [19]
Tao et al.

[11] Patent Number: 6,134,106
[45] Date of Patent: Oct. 17, 2000

[54] WINDING CHAIN DISSIPATING UNIT SUITABLE FOR ELECTRONIC DEVICE

[75] Inventors: Chian Tao, Taipei Hsien; Eric Chang, Taipei; Chia-Jui Lin, Chang Hua Hsien, all of Taiwan

[73] Assignee: Loyalty Founder Enterprise Co., Ltd., Taoyuan, Taiwan

[21] Appl. No.: 09/456,570

[22] Filed: Dec. 8, 1999

[51] Int. Cl.[7] .............................. H05K 7/20; F28F 7/00; F28F 15/00; H01B 7/34; H01L 23/12

[52] U.S. Cl. ................ 361/687; 361/688; 361/699; 361/700; 165/80.4; 165/104.33; 174/15.2; 257/714; 257/715

[58] Field of Search .................................. 361/688, 687, 361/700, 699, 689; 165/80.4, 104.33; 174/15.2; 257/714, 715

[56] References Cited

U.S. PATENT DOCUMENTS

| | | | |
|---|---|---|---|
| 5,621,613 | 4/1997 | Haley et al. | 361/687 |
| 5,718,282 | 2/1998 | Bhatia et al. | 165/86 |
| 5,796,581 | 8/1998 | Mok | 361/687 |
| 5,822,187 | 10/1998 | Garner et al. | 361/687 |
| 5,832,987 | 11/1998 | Lowry et al. | 165/86 |

*Primary Examiner*—Leo P. Picard
*Assistant Examiner*—Tung Minh Bui
*Attorney, Agent, or Firm*—Rosenberg, Klein & Lee

[57] ABSTRACT

A winding chain dissipating unit suitable for an electronic device is disclosed. The winding chain dissipating unit has a winding chain outer tube, a winding chain inner tube, and heat pipe within the winding chain inner tube. The inner diameter of the winding chain outer tube is matched with the outer diameter of the winding chain inner tube so as to have a smaller front end and a larger rear end. Moreover, an elastic element is installed at a position between the front end of the winding chain inner tube and the front wall of the winding chain outer tube so that the winding chain inner tube generates a continuously front pulling force to the winding chain outer tube. Once a wear from rotation friction therebetween is formed, the winding chain inner tube will move forwards gradually so as to automatically adjust and compensate the gap from the wear. That is, the outer diameter of the winding chain inner tube tightly contacts with the inner diameter of the winding chain outer tube until the stopping ring ejects against the rear wall of the winding chain outer tube so as not be adjusted again. As a result, the winding chain dissipating block formed by two winding chain dissipating units can be applied to a pivotal portion between the mainframe seat of a notebook computer and a screen seat. Thus, the heat emitting from the microprocessor within the mainframe seat can be transferred effectively to the radiating aluminum plate of the screen seat and thus, heat is transferred effectively.

12 Claims, 9 Drawing Sheets

WINDING CHAIN DISSIPATING UNIT SUITABLE FOR ELECTRONIC DEVICE

FIELD OF THE INVENTION

The present invention relates to a winding chain dissipating unit suitable to be used in an electronic device, and especially to a winding chain dissipating block formed by winding chain dissipating units which can be installed at the pivotal portion of a notebook computer or other related electronic device for transferring heat emitting from a heat emitting element of one seat to the radiating element of another seat for dissipating heat. Thus, the heat conduction will not be effected due to the friction of rotation.

BACKGROUND OF THE INVENTION

In general, it is required that the volume of a notebook computer to be more and more compact. Conventionally, an aluminum plate is directly adhered to and presses a microprocessor for dissipating heat of the central processing unit, or a heat pipe is connected to the aluminum plate for radiating. Recently, as in U.S. Pat. Nos. 5781409 and 5832987, a winding chain dissipating block is installed at the pivotal portion between the mainframe seat (or the first seat of an electronic device) and the screen seat (or second seat), which is matched with a heat pipe. Thus, the heat of microprocessor (heat emitting element) in the mainframe seat (first seat) is transferred to the radiating aluminum plate (heat emitting element) within the screen seat (second seat). Thus, the space is used effectively and heat is dissipated efficiently. The winding chain dissipating block is essentially formed by two winding chain dissipating units. The structure of each winding chain dissipating unit 1 is as that shown in FIGS. 1 and 2. The winding chain dissipating unit includes a hollow winding chain outer tube 10. The winding chain outer tube 10 has equal diameter in the axial direction. A heat pipe 11 is further included. One end of the heat pipe 11 has an end connected to a heat emitting element, such as a microprocessor, or connected to a radiating element, such as an aluminum plate. While another end is attached to a winding chain inner tube 12 with an inner diameter approximately equaling to the inner diameter of the winding chain outer tube 10. The winding chain inner tube 12 is pivotally inserted into the winding chain outer tube 10 to be rotated, respectively. Thus, in embodying, two winding chain dissipating units 1 are combined and locked to be placed at the pivotal portion between the mainframe seat (first seat) and the screen seat (second seat) so that the heat pipe 11 of one winding chain dissipating unit 1 is connected to a microprocessor (heat emitting element), while the heat pipe 11 of another winding chain dissipating unit 1 is connected to a heat dissipating aluminum plate (radiating element).

Figure 1:
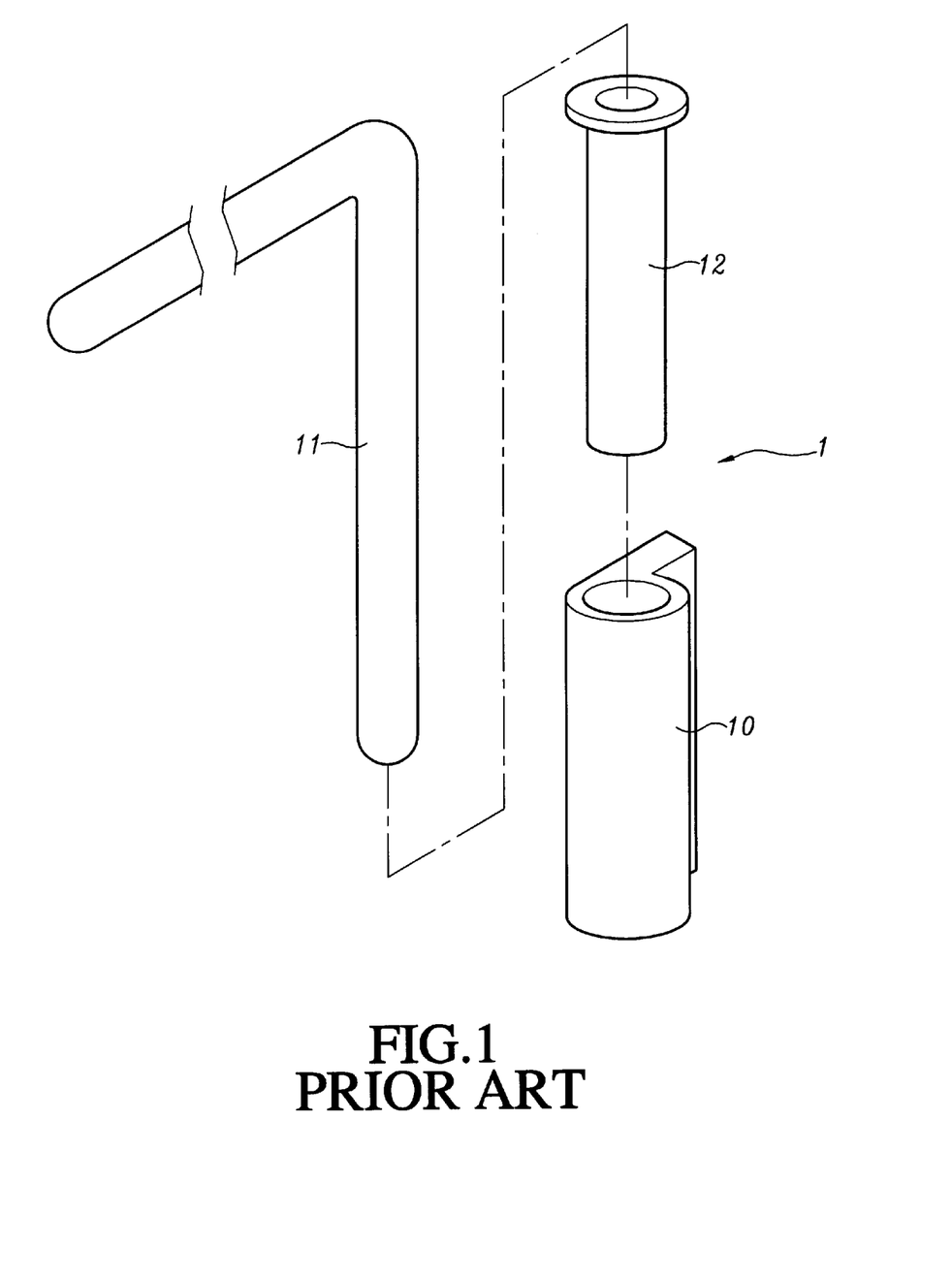
FIG. 1 is a structural exploded perspective view of a conventional winding chain dissipating unit.
Figure 2:
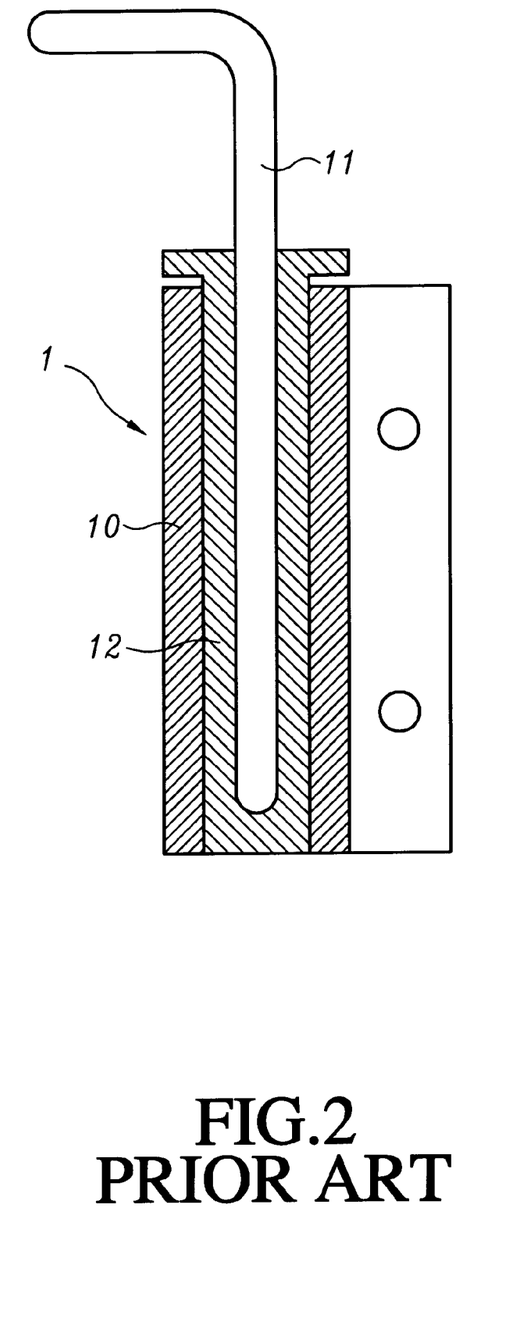
FIG. 2 is an axial cross sectional view of a conventional winding chain dissipating unit.

However, in the winding chain dissipating unit 1, the outer diameter of the winding chain inner tube 12 is equal in the whole axial direction and the inner diameter of the winding chain outer tube 10 is also equal in the whole axial direction. Therefore, the two tubes possible slide axially with one another. Moreover, the outer wall of the winding chain inner tube 12 and the inner wall of the winding chain outer tube 10 will possible rub with one another due to the opening and closing actions of the mainframe seat (first seat) and the screen seat (second seat). For a long period of time, the gap therebetween will be enlarged due to wear therebetween. Thus, the inner wall of the winding chain outer tube 10 can not be tightly adhered to the outer wall of the winding chain inner tube 12. That is, the contact area therebetween is reduced gradually so that the heat dissipating efficiency is decreased greatly. Thus, the radiating of the microprocessor is deteriorated.

Therefore, there is an eager demand for an novel winding chain dissipating units, which can overcome the reduction of heat transfer due to the enlarged gap of the winding chain outer tube and the winding chain inner tube from wearing.

SUMMARY OF THE INVENTION

Accordingly, the primary object of the present invention is to provide a winding chain dissipating unit suitable for an electronic device. The inner diameter of the winding chain outer tube is matched with the outer diameter of the winding chain inner tube so as to have a smaller front end and a larger rear end. Moreover, an elastic element is installed at a position between the front end of the winding chain inner tube and the front wall of the winding chain outer tube so that the winding chain inner tube generates a continuously front pulling force to the winding chain outer tube. Once a wear from rotation friction therebetween is formed, the winding chain inner tube will move forwards gradually so as to automatically adjusted and compensated the gap from the wear. That is, the outer diameter of the winding chain inner tube tightly contacts with the inner diameter of the winding chain outer tube until the stopping ring ejects against the rear wall of the winding chain outer tube so as not be adjusted again.

Another object of the present invention is to provide a winding chain dissipating unit suitable for an electronic device. Wherein a winding chain dissipating blocks formed by two winding chain dissipating units which are integrally formed or by locking together can be applied to a pivotal portion between the mainframe seat of a notebook computer and a screen seat. Thus, the heat emitting from the microprocessor within the mainframe seat can be transferred effectively to the radiating aluminum plate of the screen seat and thus, heat is transferred effectively. Another, the present invention can be applied to other electronic device so as to be installed at the pivotal portion between a first seat and a second seat. Consequently, the heating emitting element of the first seat is transferred to the radiating element of the second seat.

The various objects and advantages of the present invention will be more readily understood from the following detailed description when read in conjunction with the appended drawing.

DETAILED DESCRIPTION OF THE PREFERRED EMBODIMENTS

Figure 3:
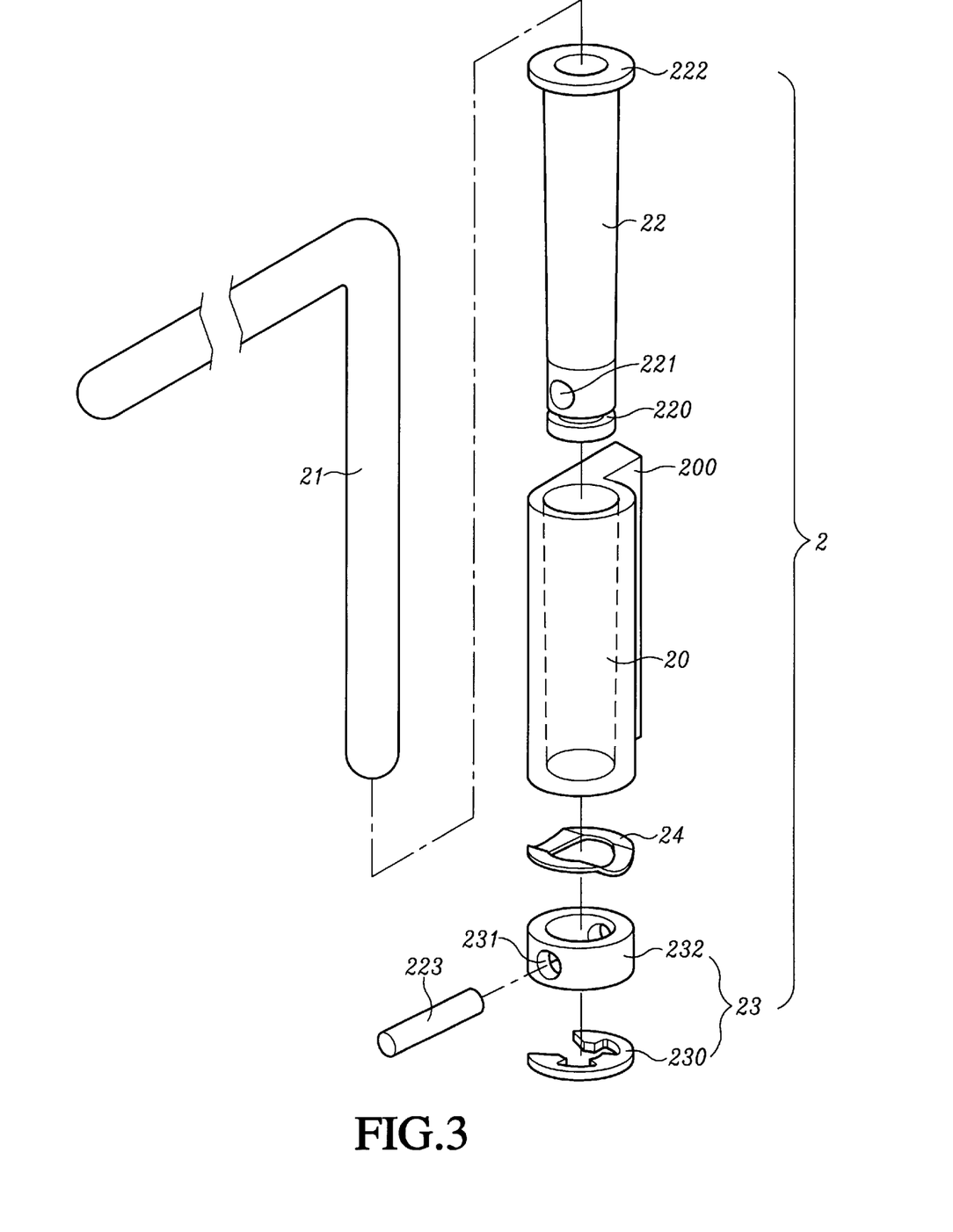
FIG. 3 is an exploded perspective view of the winding chain dissipating unit according to the present invention.
Figure 6:
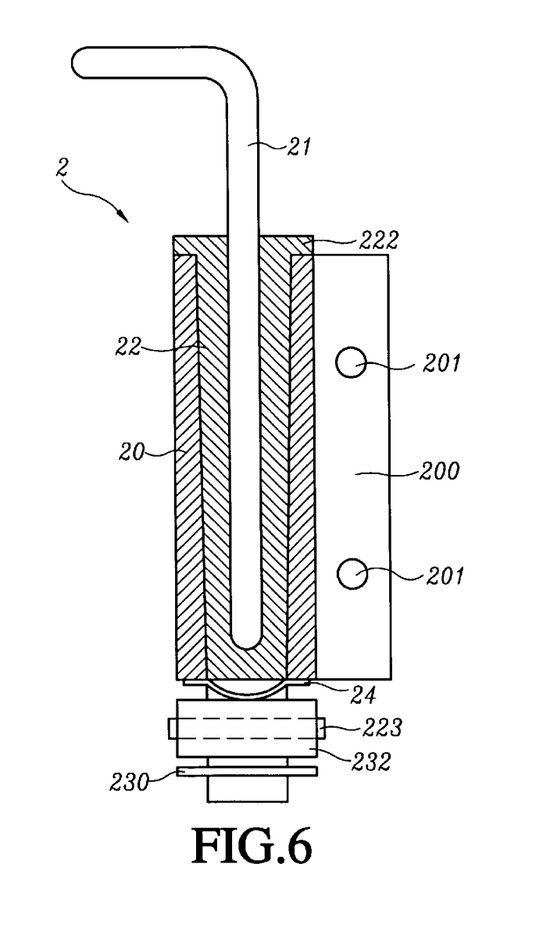
FIG. 6 is an axial cross sectional view showing that in assembling the winding chain dissipating block according to the present invention, the winding chain inner tube moves forwards to an extreme position.

With reference to FIGS. 3 and 6, an embodiment for a winding chain dissipating unit suitable for an electronic device is illustrated. The winding chain dissipating unit 2 according to the present invention has a hollow winding chain outer tube 20 and a winding chain inner tube 22 penetrated through the winding chain outer tube 20, wherein one end of the heat pipe is firmly secured to the axial center of the winding chain inner tube 22. The inner radius of the winding chain outer tube 20 is small at front end and larger at rear end. While the outer diameter of the winding chain inner tube 22 is matched to the inner diameter of the winding chain outer tube 20 so as to have a smaller front end and a larger rear end. Thus, the winding chain inner tube 22 can be inserted into the winding chain outer tube 20. Thus, as an axial forward force is applied, the winding chain inner tube 22 is tightly engaged with the winding chain outer tube 20.

A stopper 23 is formed at the front end of a portion of winding chain inner tube 22 exposed from the winding chain outer tube 20. The rear end thereof is enlarged as a stopping ring 222. A metal reed or an elastic element 24 with a type of compressible spring. The stopper 23 can have a C ring 230 as shown in figures and have a resisting block 232 having a radial penetrated pin hole 231. A ring groove 220 and a radial penetrating pin hole 221 are installed at the winding chain inner tube 22 at respective positions. Therefore, as the C ring 230 is buckled to the ring groove 220 and the resisting block 232 is fixed by a pin 223 to penetrate through the pin hole 231, the stopper 23 can suffer from the resisting force of the elastic element 24 so as to generate a forward pulling force to the winding chain inner tube 22. Therefore, a continuously forward pulling force is generated.

Figure 4:
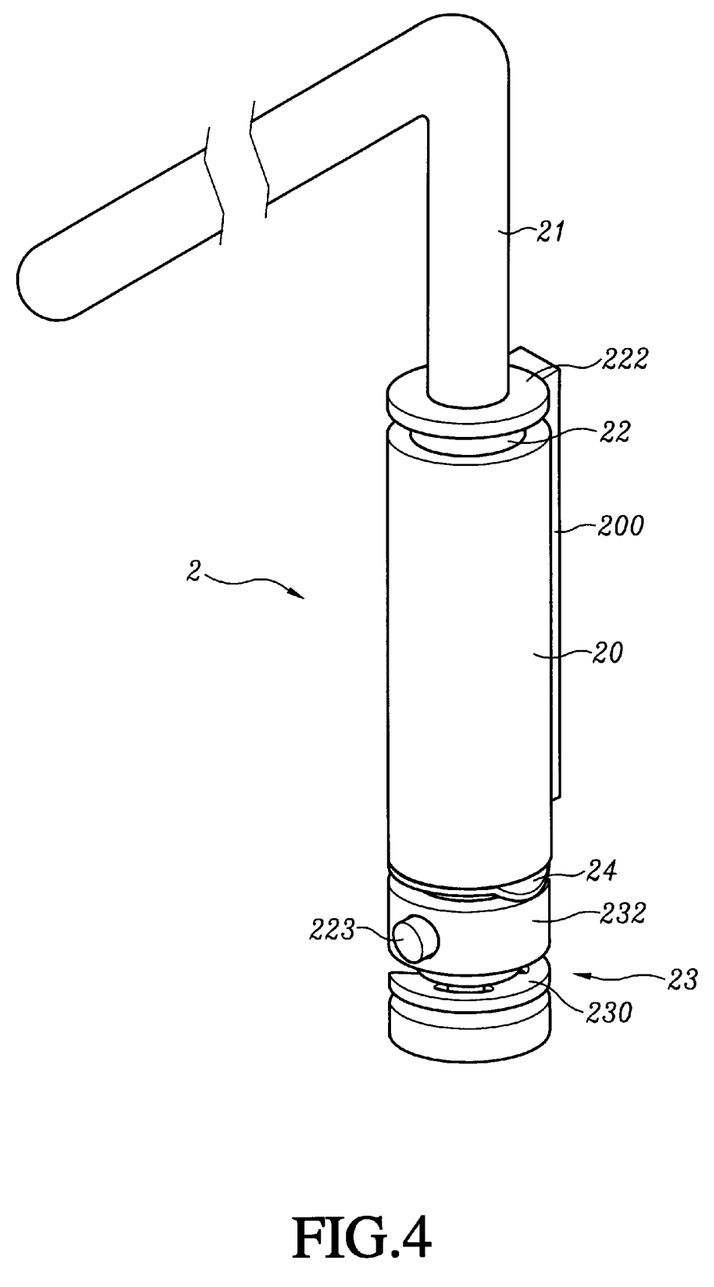
FIG. 4 is an assembled structural perspective view of the winding chain dissipating unit according to the present invention.
Figure 5:
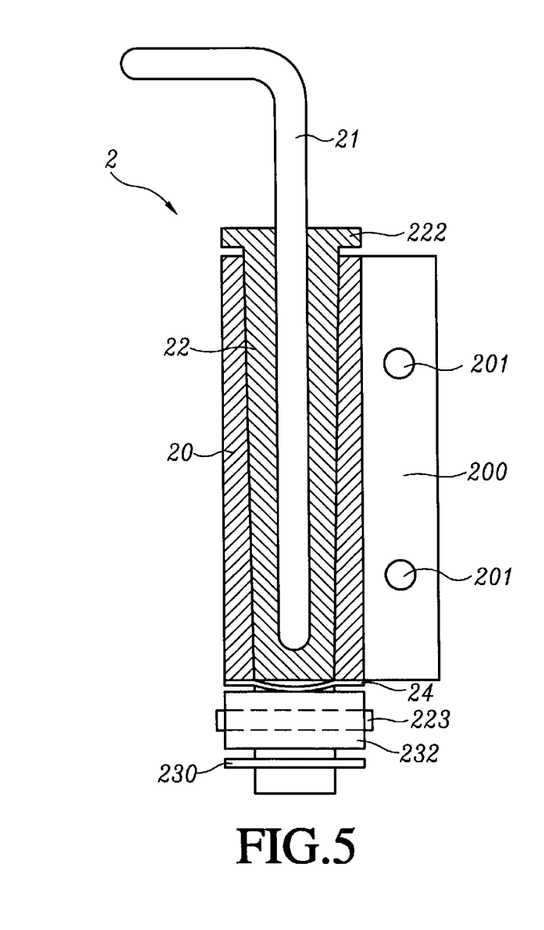
FIG. 5 is an axial cross sectional view of the winding chain dissipating unit according to the present invention.

By the aforesaid structure and technology feature, a winding chain dissipating unit as shown in FIGS. 4 and 5 can be formed. Thereby, as a gap is possibly generated between the outer wall of the winding chain inner tube 22 and the inner wall of the winding chain outer tube 20 due to wear from the friction during rotation. In one aspect, since a pulling force from the elastic element 24 is continuously acted to the winding chain inner tube 22, in another aspect, the outer diameter of the winding chain inner tube 22 and the inner diameter of the winding chain outer tube 20 have a tapered shape with a smaller front end and a large rear end. Once a wear from friction therebetween is formed, the winding chain inner tube 22 will move forwards gradually so as to automatically adjust and compensate the gap from the wear. That is, the outer diameter of the winding chain inner tube 22 tightly contacts with the inner diameter of the winding chain outer tube 20 until the stopping ring 222 ejects against the rear wall of the winding chain outer tube 20 so as not be adjusted again (as shown in FIG. 6), i. e. the initial gap between the stopping ring 222 and the winding chain outer tube 20 is properly adjusted according to the telescoping amount of the elastic element 24. Therefore, the winding chain outer tube 20 and the winding chain inner tube 22 can be sustained in the maximum contact area and have a most steady heat conducting path and efficiency so as to assure a preferred radiating effect.

Figure 7:
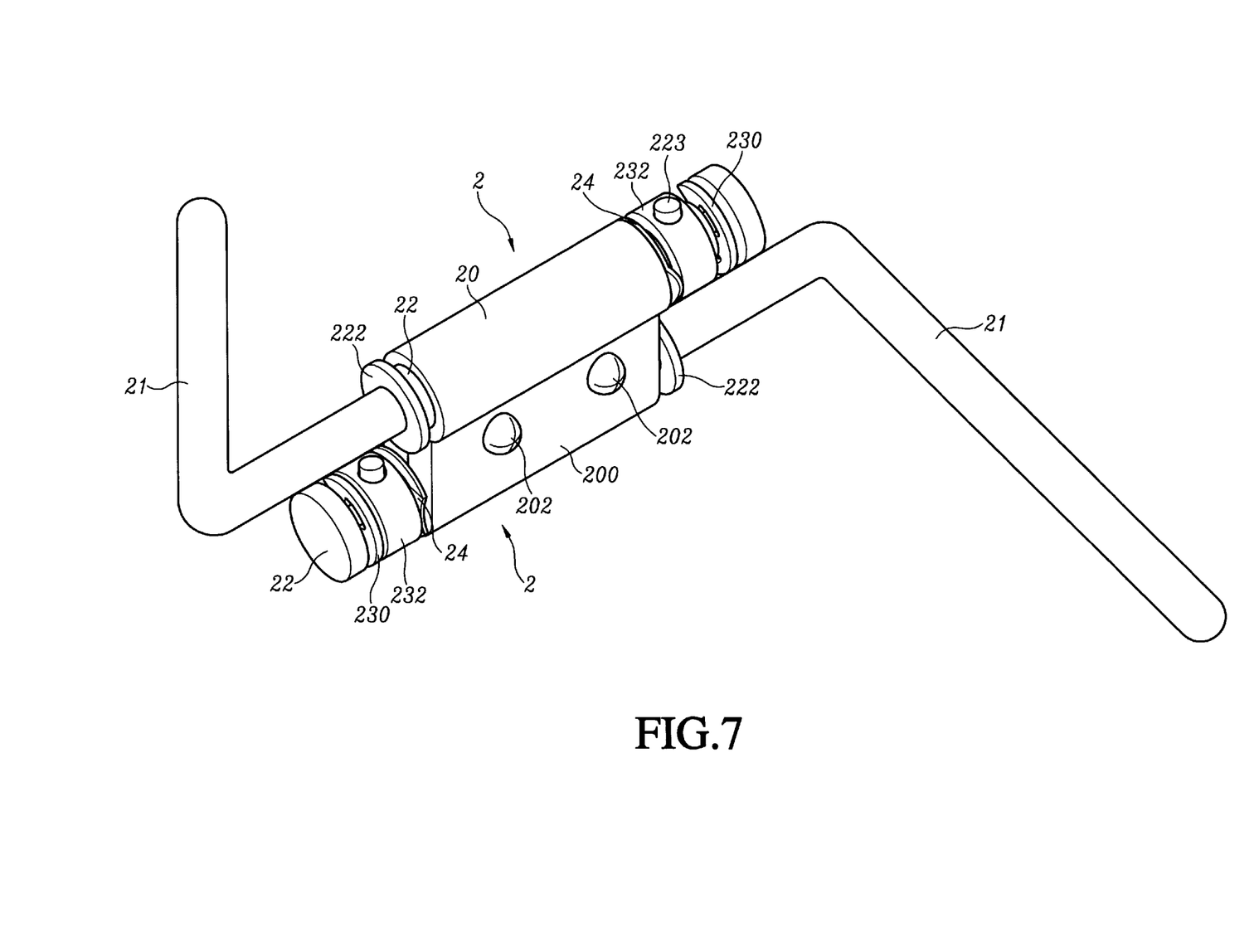
FIG. 7 is a perspective view showing that two winding chain dissipating units are assembled as a winding chain dissipating block.
Figure 8:
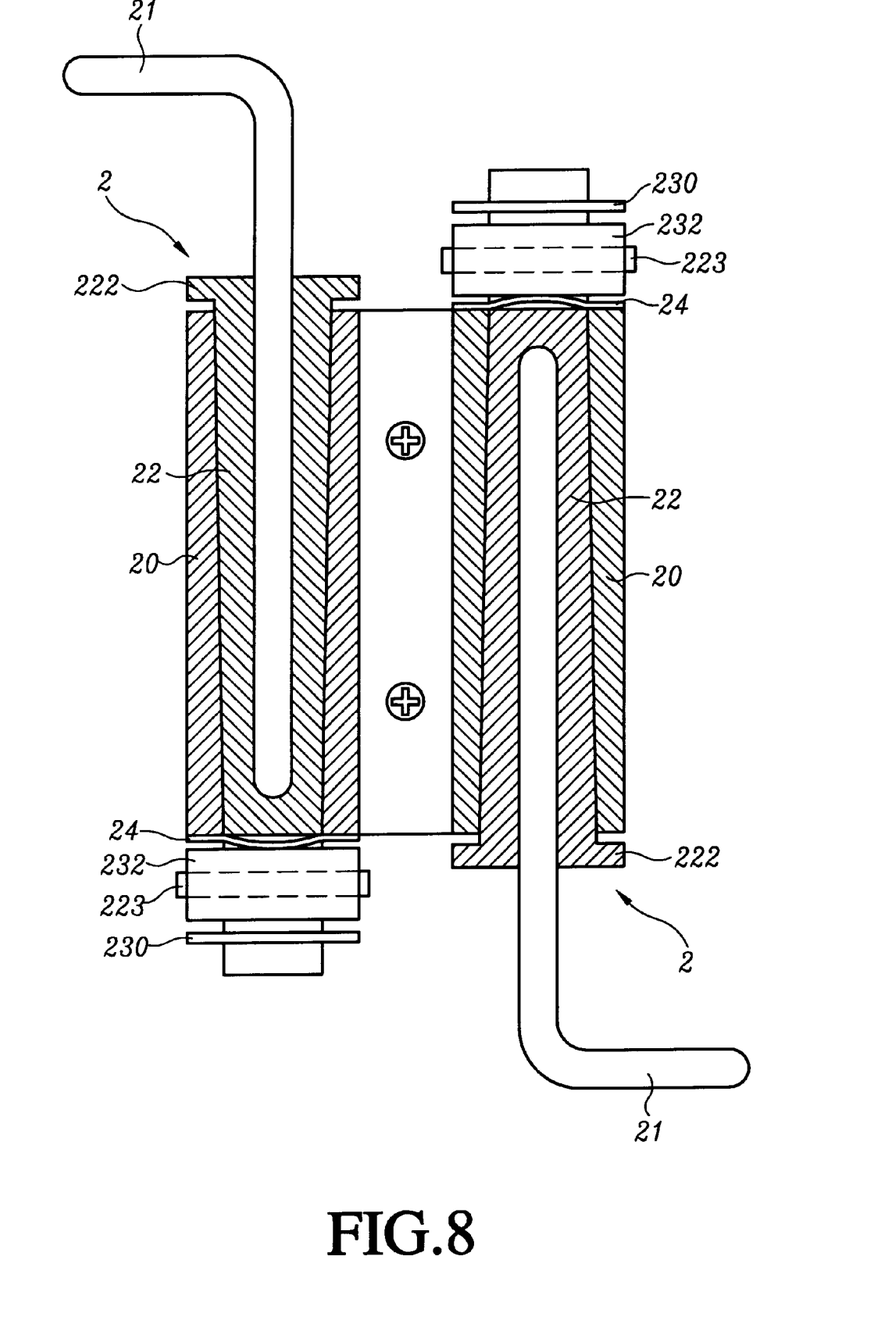
FIG. 8 is an axial cross sectional view of the winding chain dissipating block assembled from FIG. 7.
Figure 9:
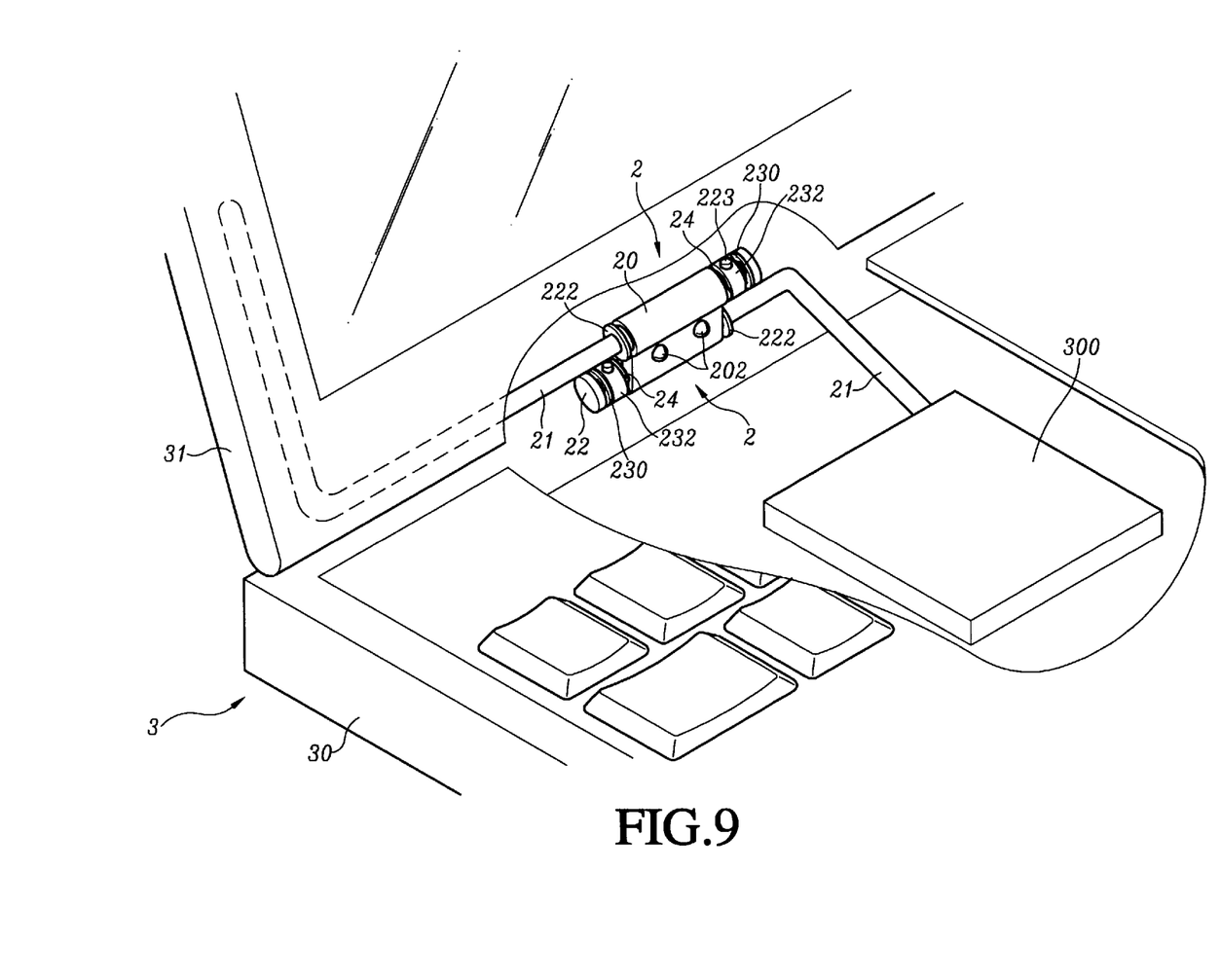
FIG. 9 is a schematic perspective view showing that the winding chain dissipating block assembled from FIG. 7 is applied to a notebook computer.

In practical using, two winding chain dissipating units 2 of identical structure can be combined as a winding chain dissipating block by the following way. Each winding chain outer tube 20 of the two winding chain dissipating units 2 are integrally formed, or a connected lateral block 200 with lock hole 201 is formed at the lateral side of each winding chain outer tube 20 so that the two winding chain dissipating units 2 can be locked together by a screw 202. Therefore, a winding chain dissipating block formed by such way can be applied to a related electronic device (not shown). The electronic device includes a first seat and a second seat which are pivotally interconnected. The first seat is installed with a light emitting element. The second seat is installed with radiating element. The winding chain dissipating block is installed at the pivotal portion between the first seat and the second seat. A heat pipe 21 of one winding chain dissipating unit 2 is connected to the radiating element. FIG. 9 shows one embodiment of the electronic device, wherein a notebook computer is illustrated. The winding chain dissipating block is installed at the pivotal portion between the mainframe seat 30 of the notebook computer 3 and the screen seat 31. Another end of the heat pipe 21 of the winding chain dissipating unit 2 is connected to the radiating aluminum plate within the screen seat 31 or the inner wall of the housing. While the heat pipe 21 of another winding chain dissipating unit 2 is connected to the microprocessor 300 within the mainframe seat 30. Thus, the wasted heat from the operation of the microprocessor 300 can be effectively and rapidly transferred to the screen seat 31 through the radiating aluminum plate or inner wall of the housing of the two heat pipes 21 and the two winding chain dissipating unit 2. Thus, the space can be used effectively and the heat dissipating is improved.

Figure 10:
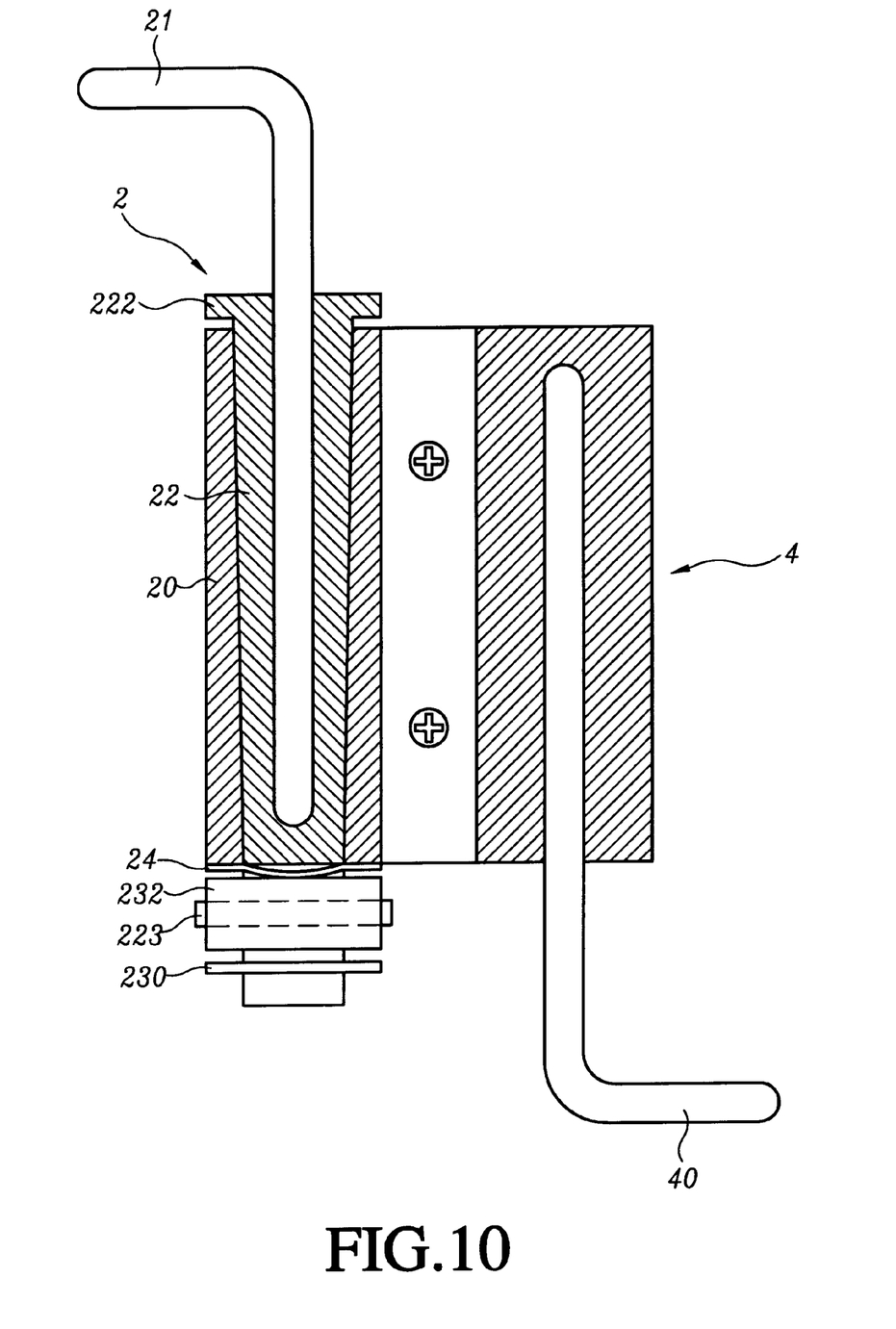
FIG. 10 is an axial cross sectional view showing that two different winding chain dissipating units are locked to become a winding chain dissipating block.

Another, in practical using, the winding chain dissipating unit 2 can be connected integrally with or locked to another winding chain dissipating unit 4 with a different structure 4 so as to be formed as a winding chain dissipating block (as shown in FIG. 10). That is, another winding chain dissipating block 4 serves for the heat pipe 40 to be directly and firmly secured to the axial center.

In summary, the present invention is suitable for the winding chain dissipating units of an electronic device. In fact, the present invention can overcome the defect in the prior art radiating elements.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An winding chain dissipating unit suitable for an electronic device, comprising:

a winding chain outer tube being a hollow tube;

a winding chain inner tube passing through the winding chain outer tube and rotationable with respect to the winding chain outer tube; and a heat pipe having a first end attaching to the winding chain inner tube, and having a second end connected to a radiating element or a heat emitting element;

characterized in that: the inner diameter of the winding chain outer tube is matched with the outer diameter of the winding chain inner tube so as to have a smaller front end and a larger rear end, moreover, an elastic element is installed at a position between a front end of the winding chain inner tube and a front wall of the winding chain outer tube so that the winding chain inner tube generates a continuously front pulling force to the winding chain outer tube.

2. The winding chain dissipating unit suitable for an electronic device as claimed in claim 1, wherein the front end of the winding chain inner tube has an enlarged stopper for clamping the elastic element between the stopper and the winding chain outer tube.

3. The winding chain dissipating unit suitable for an electronic device as claimed in claim 1, wherein the stopper has a C ring buckled to a ring groove at front end of the winding chain inner tube.

4. The winding chain dissipating unit suitable for an electronic device as claimed in claim 1, wherein the elastic element in the front end of the winding chain inner tube is a bent metal reed.

5. The winding chain dissipating unit suitable for an electronic device as claimed in claim 1, wherein the elastic element installed at the front end of the winding chain inner tube is a compressible spring.

6. The winding chain dissipating unit suitable for an electronic device as claimed in claim 1, wherein a rear end of the winding chain inner tube is enlarged as a resisting ring.

7. The winding chain dissipating unit of an electronic device as claimed in claim 1, wherein two winding chain dissipating units are interconnected to be formed as a winding chain dissipating block which is arranged at a pivotal portion between a first seat of an electronic device having a radiating element and a second seat of an electronic device having a heat emitting element, so that the heat pipe of the winding chain dissipating unit is connected to the heat emitting element, while the heat pipe of another winding chain dissipating unit is connected to a radiating element.

8. The winding chain dissipating unit of an electronic device as claimed in claim 7, wherein the electronic device is a notebook computer, the first seat is a mainframe seat, the heating emitting element is a microprocessor, the second seat is a screen scat, and the radiating element is a heat radiating aluminum plate with the screen seat or a housing.

9. The winding chain dissipating unit suitable for an electronic device as claimed in claim 7 or 8, wherein a connecting lateral block with screw hole protrudes from the lateral side of the winding chain outer tube, thus the lateral block can be locked to another winding chain dissipating unit with a connecting lateral block so as to be formed as a winding chain dissipating block.

10. The winding chain dissipating unit suitable for an electronic device as claimed in claim 7 or 8, wherein winding chain outer tubes of two winding chain dissipating units are connected as an integral body by screws so as to form a winding chain dissipating block.

11. The winding chain dissipating unit suitable for an electronic device as claimed in claim 9, wherein another winding chain dissipating unit is directly secured with a heat pipe without any winding chain outer tube and winding chain inner tube.

12. The winding chain dissipating unit suitable for an electronic device as claimed in claim 10, wherein another winding chain dissipating unit is directly secured with a heat pipe without any winding chain outer tube and winding chain inner tube.

* * * * *